United States Patent [19]
Whang

[11] Patent Number: 4,767,251
[45] Date of Patent: Aug. 30, 1988

[54] CANTILEVER APPARATUS AND METHOD FOR LOADING WAFER BOATS INTO CANTILEVER DIFFUSION TUBES

[75] Inventor: J. S. Whang, Scottsdale, Ariz.

[73] Assignee: Amtech Systems, Inc., Tempe, Ariz.

[21] Appl. No.: 860,661

[22] Filed: May 6, 1986

[51] Int. Cl.$^4$ ............... F16B 39/24; F27D 3/00
[52] U.S. Cl. .................... 414/147; 414/152; 432/11; 432/239
[58] Field of Search ........... 432/11, 123, 239, 208; 414/147, 152, 156

[56] References Cited

U.S. PATENT DOCUMENTS

| | | | |
|---|---|---|---|
| 4,459,104 | 7/1984 | Wollmann | 432/123 |
| 4,468,195 | 8/1984 | Sasaki et al. | 432/239 X |
| 4,518,349 | 5/1985 | Tressler | 414/156 X |
| 4,523,885 | 6/1985 | Bayne et al. | 414/156 |
| 4,543,059 | 9/1985 | Whang et al. | 432/11 |
| 4,613,305 | 9/1986 | Sakurai | 414/152 X |

*Primary Examiner*—James T. McCall
*Attorney, Agent, or Firm*—Cahill, Sutton & Thomas

[57] ABSTRACT

An apparatus for loading semiconductor wafers into a cantilever diffusion tube includes a cantilever paddle supporting a boatload of wafers. The paddle is moved into alignment with the open end of the cantilever diffusion tube. The open end portion of cantilever diffusion tube is moved to surround the paddle and boat load of wafers. The paddle is lowered slightly, causing the boat load of wafers to be supported on an inside surface of the cantilever diffusion tube and providing clearance around the paddle. The cantilever tube is withdrawn from the paddle, which then is withdrawn from the path of the cantilever diffusion tube. The cantilever tube and the boatload of wafers is moved into the hot zone of the furnace. After a heat treating operation, the cantilever diffusion tube is withdrawn from the furnace, and the reverse operation is performed to unload the boatload of wafers. In one embodiment of the invention, a plug is inserted into the open end of the cantilever diffusion tube after the boat load of wafers is loaded therein. In another embodiment, a tube passes through the plug and communicates with an external coupling to an external gas source.

22 Claims, 4 Drawing Sheets

CANTILEVER APPARATUS AND METHOD FOR LOADING WAFER BOATS INTO CANTILEVER DIFFUSION TUBES

BACKGROUND OF THE INVENTION

The invention relates to apparatus and methods for loading wafers into cantilever diffusion tubes of the type described in commonly owned U.S. Pat. No. 4,459,104.

Commonly owned U.S. Pat. No. 4,459,104 discloses a cantilever diffusion tube apparatus including a quartz cantilever tube having a supported end clamped to a laterally movable carriage mechanism that in turn moves on a track. The cantilever tube has an outer or distal open end portion through which a plurality of spaced semiconductor wafers supported in a wafer boat are loaded into the cantilever tube. The cantilever tube is coaxially in alignment with a diffusion tube of a furnace. The proximal or support end of the cantilever tube is sealed by a door plate through which a gas conducting tube extends. The carriage then moves the cantilever tube and wafers supported therein into the diffusion tube. Reactant gases are caused to flow into the cantilever tube between the heated wafers and out of the cantilever tube. Purging gases are caused to flow through the cantilever tube and between the wafers therein while withdrawal of the cantilever tube from the diffusion tube occurs, avoiding excessive thermal shock to the wafers, premature exposure of the hot wafers to ambient oxygen molecules, and avoiding exposure of the wafers to ambient air containing defect-causing particles that can adhere to the wafers. The cantilever diffusion tube disclosed in U.S. Pat. No. 4,459,104 has a side window opening through which the wafer boat and wafers therein are loaded into and cut of the cantilever tube. To avoid problems associated with loading wafers through the side window, the slotted tube and loading apparatus and technique disclosed in commonly owned U.S. Pat. No. 4,543,059 was developed.

Although commercially quite successful, the slotted cantilever tube and associated wafer loading system disclosed in commonly owned U.S. Pat. No. 4,543,059 is more expensive than would be desirable. A plurality of relatively short wafer boats each abutting the other form a sealing cover for an elongated loading slot in the bottom distal portion of the slotted cantilever tube. The slotted cantilever tube itself is more expensive to manufacture than would be the case if the loading slot were omitted. The cantilever tube would be somewhat more rigid and less susceptible to damage if the elongated loading slot were not required. The slotted cantilever tubes are much more difficult to clean, as is frequently required, than would be the case if the elongated loading slots could be omitted, because the presence of the loading slots prevents cleansing liquids such as hydrofluoric acid from being conveniently "sloshed" around the inner surface of the slotted cantilever diffusion tubes in a safe manner. Three approaches have been developed for cleaning the slotted cantilever tubes. One approach is to provide a plastic or Teflon sheath that is wrapped around the slotted cantilever diffusion tube. The thus ensheathed slotted cantilever diffusion tube then is placed on a slighlty sloped tube roller machine that then causes the ensheathed tube to rotate. Hydrofluoric acid (HF) is sprayed into a slightly elevated end of the ensheathed cantilever diffusion tube as it is rotated by the tube roller machine, cleaning of the inside surface of the tube. Then de-ionized (DI) water is sprayed into the upper end of the rotating ensheathed cantilever diffusion tube to rinse out the hydrofluoric acid. Although tube rollers are commonly used to to clean quartz diffusion tubes and the like, they obviously cannot be used in cantilever diffusion tube with elongated loading slots without ensheathing them in the above-mentioned Teflon or plastic sheath. Use of such ensheathing is quite inconvenient, and constitutes a deterrent to adoption of the cantilever diffusion tube system by perspective customers. Another approach to cleaning slotted cantilever diffusion tubes is to support them by hand, selectively spraying HF to cleanse the inside surfaces and then rinsing them with sprayed DI water. This approach is very labor intensive, and presents substantial safety hazards to the workers. The last approach is to support the slotted cantilever diffusion tube vertically and selectively spray HF and then rinse with DI water; again, this approach is very labor intensive, is rather unsafe, and is very unsatisfactory.

Carefully controlled experiments have been performed using the slotted cantilever diffusion tubes of commonly owned U.S. Pat. No. 4,543,059, and have shown that some leakage of gas into the cantilever diffusion tubes occurs through the elongated loading slot, despite the careful design and positioning of the wafer boats to seal the elongated loading slot. The experiments show that shifts of surface state charge ($Q_{SS}$) in test wafers are greater in portions of wafers that are nearest to the gaps associated with the elongated wafer loading slots of the slotted cantilever diffusion tubes. Those skilled in the art know that such $Q_{SS}$ shifts are a strong measure of the density of oxygen molecules to which the wafers are exposed when still hot, usually during the process of unloading wafers from a diffusion furnace. $Q_{SS}$ shifts are a cause of substantially reduced integrated circuit manufacturing yields.

Another deterrent that stands in the way of adoption of the cantilever diffusion tube system is that the specialized wafer boats, with semicylindrical bottom surfaces designed to seal the wafer loading slot, cannot be used with any of the half dozen or so popular wafer transfer machines that transfer wafers from quartz diffusion boats into plastic wafer carriers that are used in various "wet chemistry" processing operations in integrated circuit manufacturing processes.

For some semiconductor processing operations, it would be ideal to have a system wherein boat loads of wafers are entirely encapsulated and sealed from outside gases during loading into a diffusion furnace, during the heat treatment within the furnace, and during unloading of wafers from the hot zone of the furnace and subsequent cooling. Applicant's prior cantilever diffusion tube systems go a long way toward accomplishing this goal, but do not entirely eliminate effects of outside gases, especially oxygen molecules, during withdrawal of the cantilever diffusion tubes from the hot zones of diffusion furnaces. The only system that provides a completely sealed environment for semiconductor wafers during loading, heat treatment, and unloading processes is a system proposed by IBM many years ago, in which the wafers, along with a source that releases reactant gases at high temperatures inside a diffusion furnace is entirely encapsulated in a quartz ampule. After the heat treatment has been completed, the quartz ampule is struck with a hammer and shattered to allow removal of the wafers. This technique generates quartz dust, which is a source of defect-causing particles that subsequently reduce the manufacturing yield. Furthermore, this technique is expensive because the quartz ampules cannot be re-used.

There is an unmet need for a more practical technique for enclosing wafers in a controlled ambient during loading into a diffusion furnace, heat treatment therein, and unloading.

The previously disclosed wafer loading systems generally require multiple wafer loading operations to load several relatively short boat loads of wafers into the cantilever diffusion tube. As indicated above, some leakage of reactant gases through the seal formed by the round bottoms of the specialized wafer boats that cover the elongated slots inevitably occurs, increasing the likelihood of introducing defects into the wafers being processed and, in some cases, causing more rapid contamination of the main furnace diffusion tube than would otherwise be the case. The previously described cantilever diffusion tubes have the problem that systems for automating the loading of wafers therein are considerably more complex and expensive than would be desired.

Despite the great advance in the art represented by the previously described cantilever diffusion systems, there remains an unmet need for further refinement of the overall system to further reduce the effects of outside gases on the wafers, to further reduce contamination of the main furnace diffusion tube, and to make use of the cantilever diffusion tube approach less expensive and more susceptible to automation especially with respect to wafer loading techniques.

SUMMARY OF THE INVENTION

Accordingly, it is an object of the invention to provide an improved wafer loading system for the general kind of cantilever diffusion tube system described in commonly owned U.S. Pat. Nos. 4,459,104 and 4,543,059, but without providing side windows in the cantilever diffusion tube for loading and unloading of wafers and without providing an elongated slot in the distal bottom portion of the tube to effectuate loading of semiconductor wafers therein.

Briefly described, and in accordance with one embodiment thereof, the invention provides an apparatus and method for loading semiconductor wafers into a cantilever diffusion tube having an opening only at its distal end, wherein a wafer carrying device having legs for resting on the inner bottom surface of the cantilever diffusion tube is supported on a paddle that can be placed along the longitudinal axis of the cantilever diffusion tube into the path thereof as a carriage mechanism supporting the cantilever diffusion tube moves toward a furnace, the open distal end portion of the cantilever diffusion tube moving to surround the paddle, wafer carrying device, and the wafers therein without touching the inner surfaces of the cantilever diffusion tube. The paddle is lowered slightly so that legs of the wafer supporting apparatus rest on a predetermined inner surface portion of the cantilever diffusion tube and produce a small clearance between the surfaces of the paddle, the wafer carrying device, and the diffusion tube. The carriage mechanism then moves to withdraw the cantilever tube from the vicinity of the paddle while supporting the wafer carrying device and wafers therein. The paddle then is moved out of the path of the cantilever diffusion tube, which then is advanced into the furnace to position the wafers therein in the desired hot zone of the furnace. After thermal treatment of the wafers has been completed in the hot zone of the furnace, the cantilever diffusion tube is withdrawn and the wafers are removed from the cantilever diffusion tube by means of an unloading procedure that is essentially the reverse of the wafer loading procedure. In an alternate embodiment of the invention, the vertical position of the paddle remains unchanged as the distal portion of the cantilever diffusion tube is slightly raised to lift the wafer supporting device off of the paddle and produce the clearance necessary to withdraw the wafer supporting device and the distal end of the cantilever diffusion tube from the paddle during the loading operation; the reverse operation is perforated during unloading of the wafers from the cantilever diffusion tube.

In one embodiment of the invention, a cover supported by one end of the wafer carrying device covers the open distal end of the cantilever diffusion tube.

DESCRIPTION OF THE INVENTION

Figure 1:
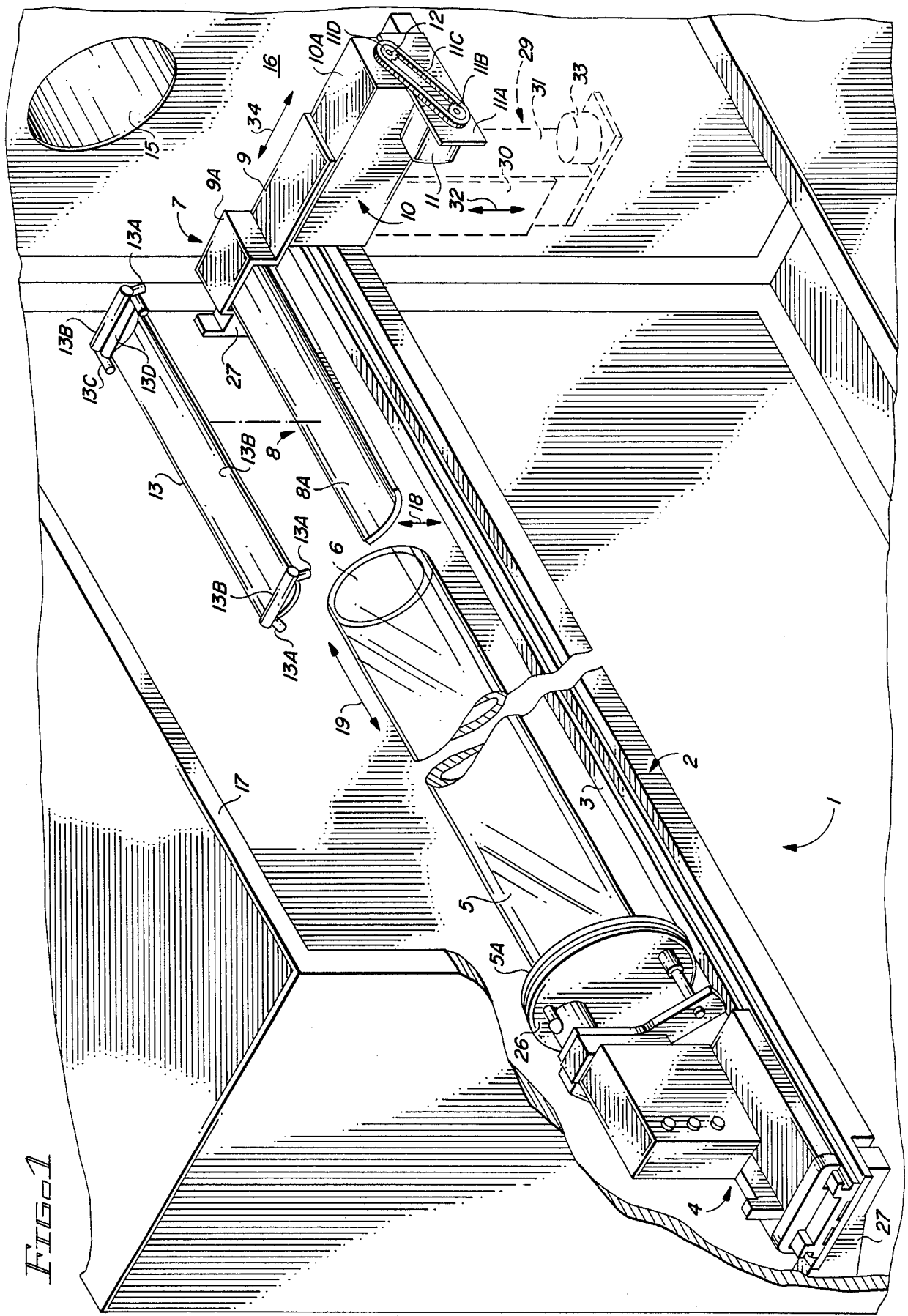
FIG. 1 is a partial perspective, partially exploded view illustrating the wafer loading apparatus of the present invention.

Referring now to the drawings, particularly FIG. 1, the cantilever diffusion tube mechanism 1 will be briefly described herein. Several related devices are described in detail in commonly owned U.S. Pat. Nos. 4,459,104, by Wollmann, issued July 10, 1984 and 4,543,059, by Whang et al., issued Sept. 24, 1985, both incorporated herein by reference.

In FIG. 1, reference numeral 2 designates a base that is supported by a pair of support arms 27, which in turn are rigidly attached to the frame structure of a wafer loading station 17 associated with a diffusion furnace 16 having a quartz diffusion tube 15 therein. A precision track 3 is supported on base 2. A carriage mechanism 4 moves horizontally in the directions indicated by arrows 19 along track 3, supporting a quartz cantilever diffusion tube 5 in coaxial alignment with quartz diffusion furnace tube 15, as described in detail in the above patents. A suitable control mechanism (not shown) effectuates insertion and withdrawal of cantilever diffusion tube 5 into and out of diffusion furnace tube 15 after one or more boat loads of semiconductor wafers have been loaded into the interior of cantilever diffusion tube 5. Suitable means for effectuating flow of reactant gases and purging gases through cantilever diffusion tube 6 and an opening in a sealed cover plate 26 that is clamped to the quartz flange 5A of cantilever diffusioon tube 5 can be provided in accordance with the teachings of the above incorporated-by-reference patents. Briefly, carriage mechanism 4 provides a suitable support for a cover plate 26 that abuts and is clamped to quartz flange 5A of cantilever diffusion tube 5, thereby supporting it in cantilever fashion. Cantilever diffusion tube 5 differs only from the particular embodiments of the cantilever diffusion tubes shown in the above patents in that it does not have a side window for loading wafers as described in the above U.S. Pat. No. 4,459,104, and does not have an elongated wafer loading slot as described in the cantilever diffusion tube of U.S. Pat. No. 4,543,059. Instead, cantilever diffusion tube 5 has only a distal end opening 6. In accordance with the present invention, one or more boat loads of wafers are loaded into the interior of cantilever diffusion tube 5 through open distal end 6 of cantilever diffusion tube 5 by means of the wafer loading mechanism 7 of FIG. 1. One or more tubes extend through cover plate 26 to conduct reactant gases and/or purging gases through cantilever diffusion tube 5.

It should be appreciated that various features may be provided in cantilever diffusion tube 5 that are not described herein. Different flange structures, for example as shown in FIGS. 6A–6C of U.S. Pat. No. 4,459,104 and in FIGS. 19 and 20 of U.S. Pat. No. 4,543,059, may be provided. Carriage mechanism 4 may incorporate the "soft landing" mechanism described with reference to FIGS. 7, 8A, 8B, 13B, 16, and 17 of above U.S. Pat. No. 4,543,059.

The automatic wafer loading mechanism 7 shown in FIG. 1 includes a cantilever "paddle" 8 that is supported at its proximal end by a bracket portion 9A of a horizontally movable carriage 9. Carriage 9 can be moved transversely to the longitudinal axis of cantilever diffusion trbe 5, in the directions indicated by arrows 34. Thus, the cantilever paddle 8 can be moved into and out of the path of movement of cantilever diffusion tube 5 along track 3, as needed to effectuate loading of semiconductor wafers into cantilever diffusion tube 5.

Alternately, the wafer loading mechanism 7 is a manually operated, rather than automatically operated device that rests in the same track 3 as the cantilever support mechanism 4. In this event, a crank handle or the like is operated to raise or lower paddle 8 in the directions of arrows 18. Instead of moving the wafer loading device 7 in the directions of arrows 34 to move it into or out of the path of the cantilever tube 5, the entire device can simply be picked up and removed from the path of the cantilever tube.

Figure 2:
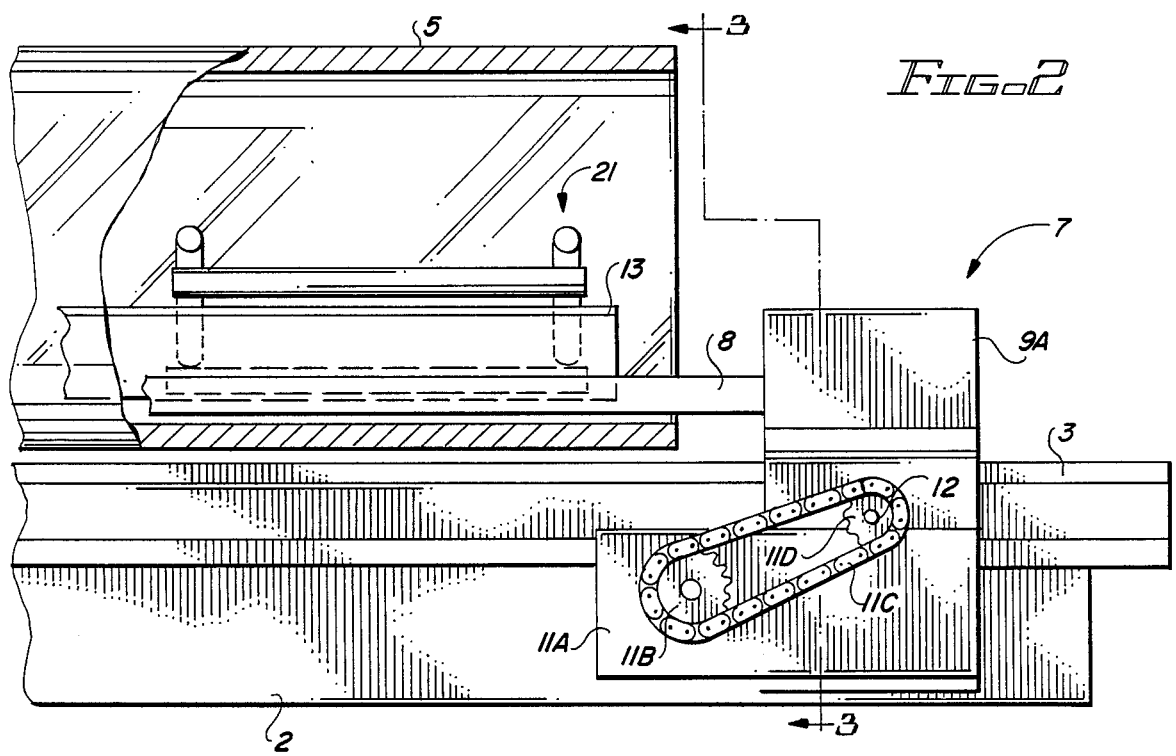
FIG. 2 is a partial cutaway side elevational view of the wafer loading apparatus of the present invention.

Returning now to the description of the automatic wafer loading mechanism 7 shown in FIG. 1, cantilever paddle 8 supports a boat load of semiconductor wafers that are to be loaded into a suitable interior portion of cantilever diffusion tube 5. In order to effectuate this, a boat carrier 13 having four legs 13A at its respective corners is placed on cantilever paddle 8 at the beginning of the wafer loading operation. One or more boat loads of wafers supported in conventional quartz diffusion boats or wafer boats are placed on the upper surface of boat carrier 13. The four legs 13A, which are oriented radially outward from a semicylindrical support section 13B of wafer boat carrier 13, extend outward over the side edges of cantilever paddle 8 when wafer boat carrier 13 rests thereon. The outer bottom surface of semicylindrical portion 13B of boat carrier 13 mates with a semicylindrical, concave surface 8A of cantilever paddle 8. The outer bottom surface of cantilever paddle 8 is also semicylindrical. Preferably, semicylindrical cantilever paddle 8 is composed of quartz, silicon carbide, or polycrystalline silicon material. Wafer boat carrier 13 is composed of the same materials that conventional wafer diffusion boats are composed, namely quartz, silicon carbide, or polycrystalline silicon. The arrangement of cantilever paddle 8, wafer boat carrier 13, wafer boat 21 (FIG. 2), and semiconductor wafers designated by dotted line 20 after the cantilever diffusion tube has been moved to the right along arrows 19, so that the distal portion of cantilever diffusion tube 5 surrounds the cantilever paddle 8 and the wafers 20, wafer boat 21, and boat carrier 13, as best seen in FIGS. 2 and 3.

Figure 3:
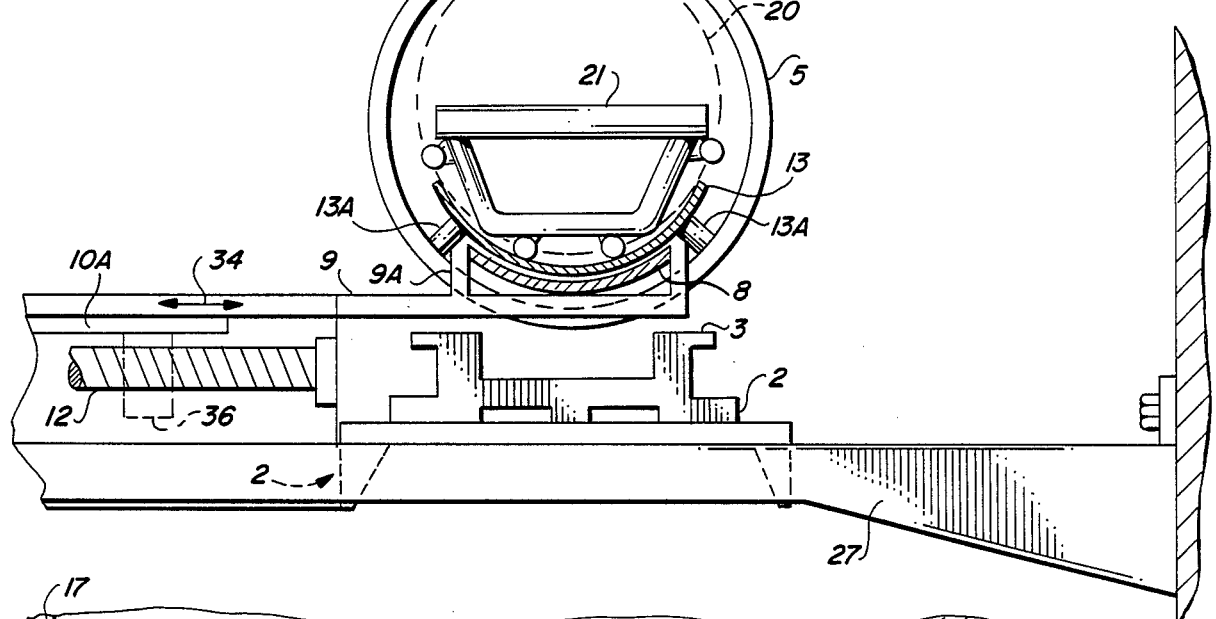
FIG. 3 is a section view through section line 3—3 of FIG. 2.

In order to achieve the configuration shown in FIG. 3, cantilever paddle 8 is lowered slightly, or alternatively, the distal end portion of cantilever diffusion tube 5 is raised slightly, so that the bottoms of the legs 13A of boat carrier 13 rest on the inner surface of cantilever diffusion tube 5, and cantilever paddle 8 is spaced from both the bottom surface of wafer boat carrier 13 and the bottom inner surface of cantilever diffusion tube 5.

Then, cantilever diffusion tube 5 can be withdrawn from the vicinity of wafer boat loading mechanism 5 (to the left in FIG. 1), leaving cantilever paddle 8 where it is, and carrying the boat carrier 13, wafer boat 21, and semiconductor wafers 20 away from cantilever paddle 8. Then, paddle carriage 9 is moved transversely (to the right along arrows 34) out of the path of cantilever diffusion tube 5. As indicated above, if a nonautomatic wafer loading device is used, the paddle carriage 9 is simply lifted off of the track 3 and removed manually, rather than automatically, from the path of the cantilever diffusion tube. Cantilever diffusion tube 5 then is moved concentrically into quartz diffusion furnace tube 15, with appropriate control of purging and/or reactant gases being provided as described in the above patents.

The reverse operation is performed in order to unload boat carrier 13, wafer boat 21, and wafers 20 from cantilever diffusion tube 5 after the desired processing in the hot zone of diffusion furnace 16 has been accomplished. More specifically, the cantilever diffusion tube 5 (and the semiconductor wafers therein) are withdrawn from quartz diffusion furnace tube 15. Cantilever paddle 8 is moved back into the path of cantilever diffusion tube 5, as shown in FIG. 1. The elevation of cantilever paddle 8 has been maintained so that when the proximal end portion of cantilever diffusion tube 5 is then moved back toward cantilever paddle 8, there will be adequate clearance between the upper surface of cantilever paddle 8 and the bottom surface of boat carrier 13 to prevent touching and scraping therebetween. Similarly, adequate tolerance is provided between the bottom surface of cantilever paddle 8 and the inner bottom surface of cantilever diffusion tube 5 to prevent scraping as cantilever diffusion tube 5 is advanced (to the right along arrows 19 in FIG. 1) until cantilever paddle 8 extends entirely under wafer boat 13.

Then, either the distal end of cantilever diffusion tube 5 is lowered slightly, or cantilever paddle 8 is raised slightly, as indicated by arrows 18 in FIG. 1, causing wafer boat carrier 13 to be effectively lifted off of the inner bottom surface of cantilever diffusion tube 5. Then, cantilever diffusion tube 5 is withdrawn to the left in FIG. 1, leaving wafer boat carrier 13 and the boat load of wafers thereon accessible. Other mechanisms, not shown, then can be used to remove the boat load of wafers from wafer boat carrier 13. Alternately this can be done by hand, by using conventional two-pronged forks that can lift the wafer boat 21 from the boat carrier 13. Alternatively, the wafer boat(s) 21 and wafer boat carrier 13 can be removed as a unit from cantilever paddle 8.

It should be appreciated that a major advantage of the above-described structure for placing wafer boats and/or the wafer boat carrier 13 onto cantilever paddle 8 is less complex, less expensive, and less precision is required than the apparatus for loading wafer boats into the slotted cantilever diffusion tubes of applicant's U.S. Pat. No. 4,543,059 or applicant's U.S. Pat. No. 4,459,104.

Paddle carriage 9 is precisely supported on a track mechanism 10A. A suitable threaded block designated by 36 in FIG. 3 or other suitable coupling mechanism translates rotation of a screw shaft 12 to precise movement of paddle carriage 9 in the directions indicated by arrows 34 in response to actuation of a stepper motor 11. Stepper motor 11 is coupled, by means of a suitable gear reduction mechanism if necessary, to a sprocket 11B, chain 11C, and sprocket 11D to screw shaft 12. The mechanism 10A can be attached in stationary relationship to the base 2 and the track 3 supporting cantilever diffusion tube 5 and its support carriage mechanism 4. In this case, the above-mentioned vertical relative movement between the distal portion of cantilever diffusion tube 5 and cantilever paddle 8 must be accomplished by adjustment of the above mentioned soft landing mechanism of carriage 4, or else the track mechanism 10A supporting carriage track 9 may be controllably movable in the vertical direction.

This can be accomplished by provision of a second carriage mechanism indicated by dotted lines 29, that is conceptually similar to automatic cantilever paddle carriage mechanism 7. Specifically, a carriage 30 that supports automatic cantilever paddle carriage mechanism 7 is movable vertically in the directions indicated by arrows 32 in response to a motor assembly 33 that is similar to the above-described assembly including stepper motor 11, sprocket 11B, support plate 11A, chain 11C, sprocket 11D, and screw gear 12. The latter assembly is supported by assembly 31 in fixed relationship to the carriage track 3. As yet another alternative, the elevation of paddle 8 could be precisely raised or lowered by incorporating a tilting mechanism into mechanism 10A to tilt carriage 9 along its longitudinal axis and thereby raise or lower bracket 9A and hence paddle 8.

Figure 4A:
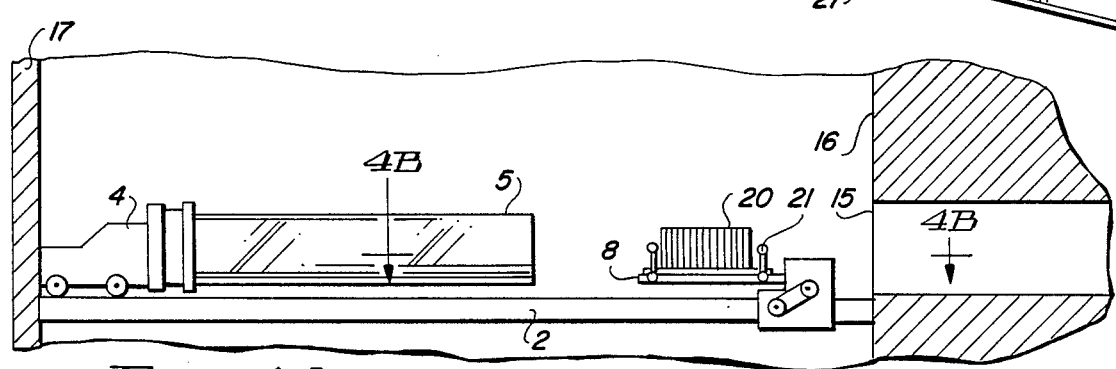
FIGS. 4A–4K constitute a sequence of partial side section view diagrams useful in describing the operation of the wafer loading apparatus of the present invention.
Figure 4B:
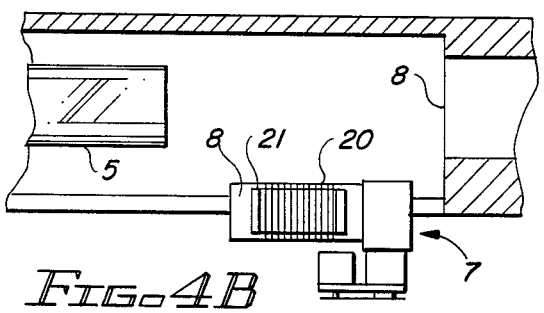
Figure 4G:
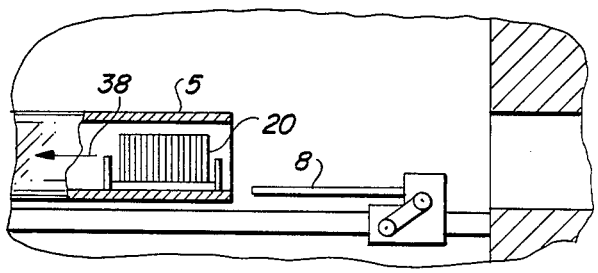
Figure 4C:
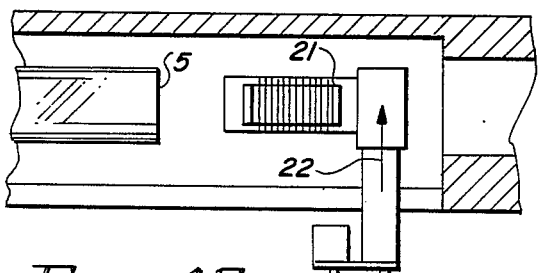

With the above-described description of the operation and the above-described description of the physical structure of the apparatus of FIGS. 1–3 in mind, a more precise description of the operation of the wafer loading system of the present invention can be understood ty reference to FIGS. 4A–4K. FIGS. 4A and 4B show the initial configuration of the cantilever diffusion tube 5 and automatic wafer loading mechanism 7 immediately after the boat load of wafers 20 has been placed on cantilever paddle 8. Then, as indicated by arrow 22 in FIG. 4C, the boat load of wafers is automatically then moved into the path of cantilever diffusion tube 5, and is precisely aligned with the open end thereof. (If a manual wafer loading mechanism is used instead of the automatic wafer loading mechanism, the maneuver illustrated in FIGS. 4B and 4C is accomplished by simply manually placing the loading mechanism in the carriage track 3.)

Figure 4H:
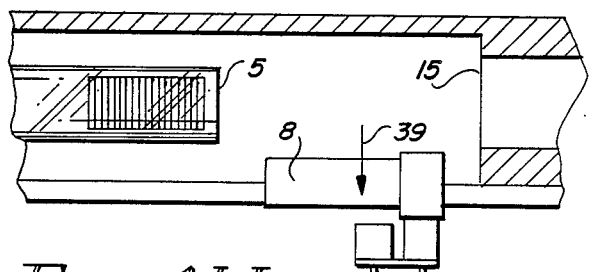
Figure 4D:
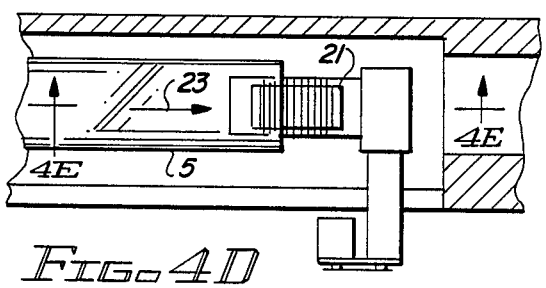
Figure 4I:
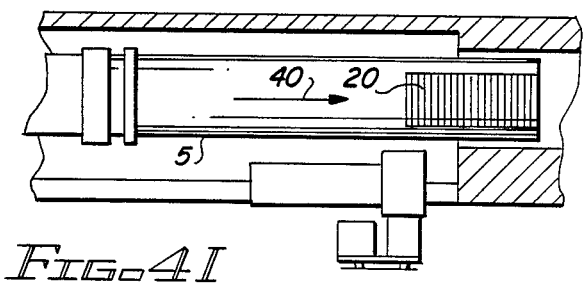
Figure 4E:
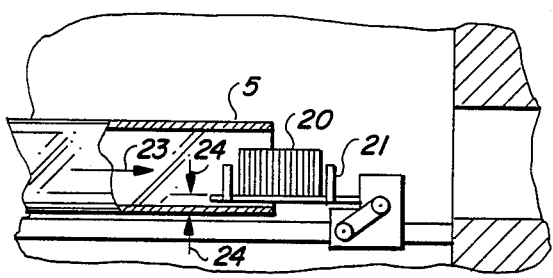

As indicated in FIGS. 4D and 4E, the next step is to move cantilever diffusion tube 5 in the direction of arrow 23, so that the distal or open end of cantilever diffusion tube 5 accepts and surrounds cantilever paddle 8, wafer boat carrier 13, and boat load of wafers 20. No portion of the wafers 20, wafer boat carrier 13, or cantilever paddle 8 touches or scrapes any inside surface portion of cantilever diffusion tube 5 during this operation. (FIG. 4E shows an elevational cutaway section view of the position of cantilever paddle 8 and wafers 5 during the movement indicated in the top view of FIG. 4D.

Figure 4J:
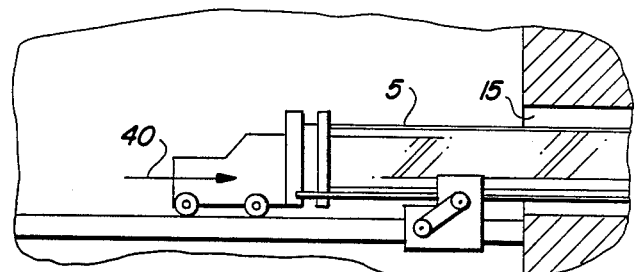
Figure 4F:
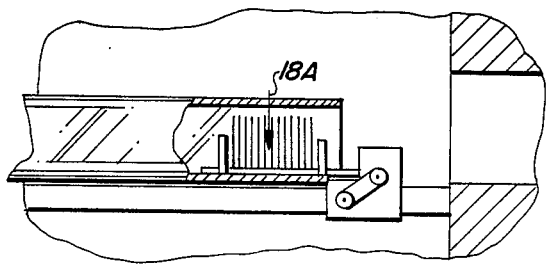

Referring next to FIG. 4F, wafer boat carrier 13, wafer boat 21, and wafers 20 supported thereon are effectively lowered, so that the bottoms of legs 13A of wafer boat carrier 13 are supported by the inner bottom surface of cantilever diffusion tube 5. Arrow 18A in FIG. 4F designates such relative lowering of the wafer boat carrier 13.

FIG. 4G illustrates the next step, wherein cantilever diffusion tube 5 with the boat load of wafers 20 therein moves in the direction indicated by arrow 38, so that cantilever paddle 8 and wafers 20 in affect are withdrawn from cantilever diffusion tube 5.

FIG. 4H illustrates the next step, wherein the cantilever paddle 8 is automatically withdrawn in the direction of arrow 39 from the path of cantilever diffusion tube 5. Alternately, if a manual wafer loading device is utilized, then the maneuver illustrated in FIG. 4H is performed by simply lifting the manual wafer loading mechanism out of the track 3. FIG. 4I shows the next step, in which cantilever diffusion tube 5 and the boat load of wafers 20 therein are moved in the direction of arrow 40 so that the boat load of wafers 20 is ultimately positioned in the desired hot zone portion of quartz diffusion furnace tube 15. Arrow 40 in FIG. 4J represents the continued movement of cantilever diffusion tube 5 into quartz diffusion furnace tube 15, as described in more detail in the above incorporated-by-reference patents.

Figure 4K:
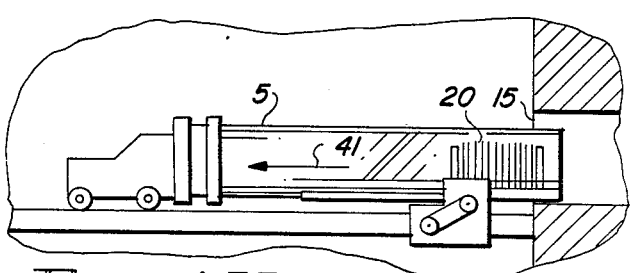

Finally, FIG. 4K designates the withdrawal of diffusion furnace tube 5 out of quartz diffusion furnace tube 15, as indicated by arrow 41. The remaining steps of unloading the wafer boat from inside cantilever diffusion tube 5 are in essence the reverse of the above-described loading sequence of steps.

The above-described wafer loading system is advantageous over the wafer loading systems that have been previously devised to load wafers into cantilever diffusion tubes, in that the present system is much less complex and more practical than prior wafer loading systems. For example, the automatic wafer loading system 7 of the present invention is less expensive to implement than the wafer loading system outlined with reference to FIG. 9 in applicant's U.S. Pat. No. 4,543,059. A manual wafer loading system is even less expensive. The cost of manufacturing the quartz cantilever diffusion tubes 5 with openings only at the extreme ends thereof, is less than is the case for the cantilever diffusion tubes having the openings needed to accommodate prior wafer loading systems. The quartz cantilever diffusion tubes themselves are somewhat stronger and less resistant to breakage and high temperature say than is the case for the previous quartz cantilever diffusion tubes. The quartz cantilever diffusion tubes 5 of the present invention are much more easily cleaned using conventional tube rollers to effectuate hydrofluoric acid etching techniques than is the case for previous cantilever diffusion tubes having additional openings therein the accommodate wafer loading apparatus. The problem of leakage of oxygen gas into the cantilever diffusion tube and causing $Q_{SS}$ shifts in wafers closest to the wafer loading slots is avoided, resulting in higher quality integrated circuits and higher manufacturing yields. And, of course, the problem of out leakage of reactant gases around the sealing means provided to prevent such leakage in the prior cantilever diffusion tubes at the openings thereof provided for accommodating wafer loading and resulting contamination of the furnace 15 is completely avoided by the present invention.

Figure 5:
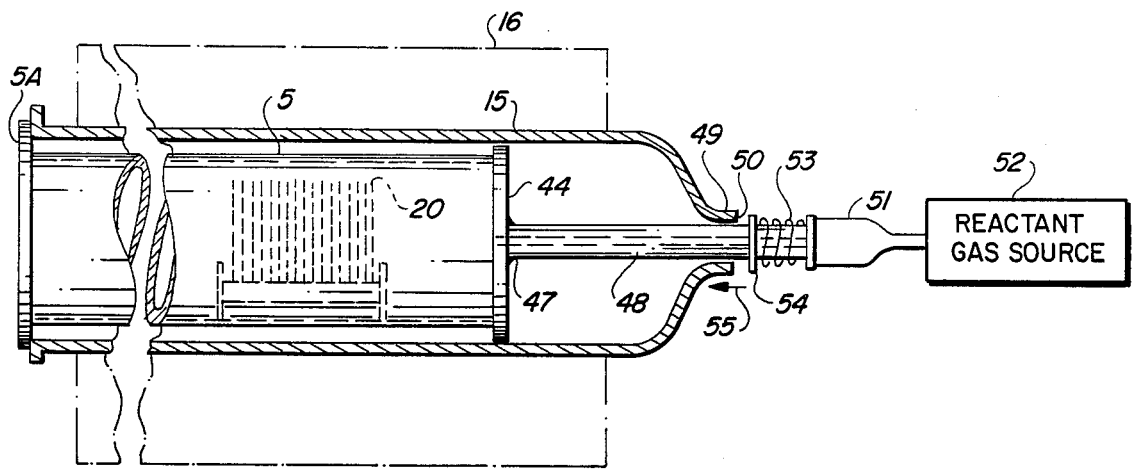
FIG. 5 is a partial section view of an alternate embodiment of the invention showing an end seal for the open distal end of the cantilever diffusion tube supported in the remote end of the furnace table.

An end seal plate for the cantilever tube is illustrated in FIG. 5 wherein a rigid tube 47 is attached to the outer face of end plate 44. Tube 47 communicates with the interior of the cantilever diffusion tube 5, and extends out through an opening 50 of pigtail 49 of diffusion furnace tube 15. The distal end of tube 47 is connected by a flexible coupler 51 to the external reactant gas source 52. A bias spring 53 and bearing flange 54 urge tube 47 and hence seal plate 44 tightly against the lip of the open end of cantilever tube 5, in the direction of arrow 55. If necessary, seal plate 44 can be pivotally supported on the left end of support tube to effectuate a tight seal with cantilever tube 5. The seal of end cap 44 with the mouth 6 of cantilever diffusion tube 5 thereby can be made sufficiently tight that entry of oxygen molecules into cantilever diffusion tube 5 during withdrawal thereof from diffusion furnace tube 15 is essentially eliminated.

While the invention has been described with reference to a particular embodiment thereof, those skilled in the art will be able to make various modifications to the described embodiment of the invention without departing from the true spirit and scope thereof. It is intended that all cantilever diffusion tubes and systems for loading wafers therein which are equivalent to those described herein in that they perform substantially the same function in substantially the same way to achieve substantially the same result are within the scope of the present invention.

What is claimed is:

1. A method of loading semiconductor wafers into a stationary furnace tube, the method comprising the steps of:
   (a) providing a cantilever diffusion tube having a longitudinal axis and a distal open end portion;
   (b) providing a boat carrier with a plurality of support legs, and supporting a wafer boat loaded with wafers on the boat carrier;
   (c) placing the boat carrier with the loaded wafer boat thereon upon a cantilever member so that the support legs hang downward below edges of the cantilever member;
   (d) moving the cantilever diffusion tube along a path in the direction of the longitudinal axis to position the distal open end portion of the cantilever diffusion tube around the cantilever member, the boat carrier, and the loaded wafer boat so that the boat carrier, the loaded wafer boat, and a distal end portion of the cantilever member are suspended inside the cantilever diffusion tube;
   (e) causing relative vertical movement between the cantilever diffusion tube and the cantilever member to, in effect, lower the support legs onto an inner bottom surface of the cantilever diffusion tube and thereby provide clearance between the cantilever member, the boat carrier and the cantilever diffusion tube;
   moving the cantilever diffusion tube and the boat carrier and loaded wafer boat therein away from the cantilever member;
   moving the cantilever member out of the path of the cantilever diffusion tube; and
   moving the cantilever diffusion tube along its path into a furnace tube.

2. The method of claim 1 wherein step (c) includes supporting a proximal end portion of the cantilever diffusion tube by means of a first carriage mechanism on a first track, the moving of the cantilever diffusion tube being accomplished without any portion of the cantilever member, the boat carrier, the loaded wafer boat, or any of the wafers touching any portion of the cantilever diffusion tube.

3. The method of claim 2 including attaching a proximal end portion of the cantilever member to a second carriage mechanism, wherein step (f) includes moving the second carriage mechanism away from the path of the cantilever diffusion tube.

4. The method of claim 2 wherein step (d) includes moving the cantilever member slightly downward to rest the support legs of the boat carrier on the inner bottom portion of the cantilever diffusion tube and provide the clearance.

5. The method of claim 2 wherein step (d) includes slightly raising the distal open end portion of the cantilever diffusion tube so that the support legs of the boat carrier rest on the inner bottom surface of the cantilever diffusion tube.

6. The method of claim 5 wherein the raising of the distal open end portion of the cantilever diffusion tube is accomplished by slightly tilting the cantilever diffusion tube by means of the first carriage mechanism.

7. The method of claim 3 including supporting the second carriage mechanism on a second track that is attached in fixed relationship to the first track.

8. The method of claim 2 including providing the boat carrier as an integral part of the wafer boat.

9. The method of claim 2 wherein step (e) includes moving the loaded wafer boat into a hot zone of the furnace by moving the cantilever diffusion tube into the furnace tube.

10. The method of claim 9 further including the steps of moving the cantilever diffusion tube along the path to withdraw the cantilever diffusion tube from the furnace, moving the cantilever member back into the path, moving the cantilever diffusion tube along the path to cause the distal open end portion of the cantilever diffusion tube surround a portion of the cantilever member so that the distal end portion of the cantilever member moves between the boat carrier and the bottom inner surface of the cantilever diffusion tube without touching either, causing relative vertical movement between the cantilever diffusion tube and the cantilever member to, in effect, lift the support legs above the inner bottom surface of the cantilever tube, and moving the cantilever diffusion tube away from the cantilever member, the wafer boat carrier, and the loaded wafer boat thereon without touching any portion of the cantilever diffusion tube.

11. The method of claim 2 including providing the cantilever member, the boat carrier, and the wafer boat of material selected from the group consisting of quartz, silicon carbide, and polycrystalline silicon.

12. The method of claim 10 including sealing the distal open end portion of the cantilever tube during step (g).

13. The method of claim 12 including providing an opening in a plate sealing the distal open end of the cantilever tube to allow flow of gas therethrough.

14. The method of claim 13 including providing a tube connected to the plate and connecting an external gas source to an end portion of the tube to effectuate flow of gas through the cantilever diffusion tube.

15. The method of claim 12 including unsealing the end of the cantilever diffusion tube during the step of withdrawing the cantilever diffusion tube from the furnace tube.

16. An apparatus for loading semiconductor wafers into a furnace tube, the apparatus comprising in combination:
(a) a cantilever diffusion tube having a longitudinal axis, a distal open end portion, and a proximal end portion supported in a cantilever fashion by means of a first carriage mechanism that moves the cantilever diffusion tube along a path in the direction of its longitudinal axis into a stationary furnace tube;
(b) means for carrying the wafers;
(c) a cantilever member having a distal end portion and a proximal end support portion for supporting the wafer carrying means;
(d) means attached to the proximal end support portion for supporting the cantilever member in aligned relationship with the distal open end portion of the cantilever diffusion tube;
(e) means for moving the first carriage mechanism to position the distal open end portion of the cantilever diffusion tube so as to surround the wafer carrying means, a portion of the cantilever member, and the wafers carried by the wafer carrying means; and
(f) means for causing the relative vertical movement between the cantilever member and the cantilever diffusion tube to, in effect, lower the wafer carrying means onto an inner bottom surface of the cantilever diffusion tube and produce clearance between the cantilever member and the wafer carrying means.

17. The apparatus of claim 16 wherein the wafer carrying means includes a boat carrier for supporting a boat loaded with the wafers.

18. The apparatus of claim 17 wherein the boat carrier includes a plurality of legs that extend below opposed edges of the cantilever member.

19. The apparatus of claim 16 wherein the cantilever member is composed of material selected from the group consisting of quartz, silicon carbide, and polycrystalline silicon.

20. The apparatus of claim 16 wherein the cantilever member supporting means includes a second carriage mechanism that moves in a direction transverse to the longitudinal axis of the cantilever diffusion tube.

21. The apparatus of claim 16 wherein the relative vertical movement causing means includes means for raising and lowering the cantilever member.

22. The apparatus of claim 16 wherein the relative vertical movement causing means includes means in the first carriage mechanism for raising or lowering at least a portion of the cantilever diffusion tube.

* * * * *